United States Patent [19]
Hernandez et al.

[11] Patent Number: 5,418,023
[45] Date of Patent: May 23, 1995

[54] METALLIZED MICROPOROUS POLYTETRAFLUOROETHYLENE ELECTROMAGNETIC ENERGY SHIELDING GASKETING

[75] Inventors: Raul Hernandez; James L. Manniso, both of Newark, Del.

[73] Assignee: W. L. Gore & Associates, Inc., Newark, Del.

[21] Appl. No.: 764,979

[22] Filed: Sep. 23, 1991

Related U.S. Application Data

[63] Continuation of Ser. No. 380,828, Jul. 17, 1989, abandoned.

[51] Int. Cl.$^6$ .............................. B29D 23/00
[52] U.S. Cl. ................... 428/36.5; 428/36.8; 428/422; 428/463
[58] Field of Search ............ 428/463, 422, 65, 323, 428/36.8, 36.5

[56] References Cited

U.S. PATENT DOCUMENTS

| | | | |
|---|---|---|---|
| 3,953,566 | 4/1976 | Gore | 428/422 X |
| 3,962,153 | 6/1976 | Gore | 428/398 X |
| 4,042,747 | 8/1977 | Breton et al. | 428/323 |
| 4,064,030 | 12/1977 | Nakai et al. | 428/421 X |
| 4,147,824 | 4/1979 | Dettmann et al. | 428/65 |
| 4,187,390 | 2/1980 | Gore | 428/36.9 |
| 4,557,957 | 12/1985 | Manniso | 428/461 X |

FOREIGN PATENT DOCUMENTS

| | | | |
|---|---|---|---|
| 0143338A2 | 6/1985 | European Pat. Off. | 428/422 |
| 234467 | 9/1987 | European Pat. Off. | |
| 2396388 | 1/1979 | France | |
| 3339018 | 5/1985 | Germany | |
| 1168184 | 10/1969 | United Kingdom | |

*Primary Examiner*—Stevan A. Resan
*Attorney, Agent, or Firm*—Gary A. Samuels

[57] ABSTRACT

A process and composition for sealing a flanged metal enclosure both physically and electromagnetically by a gasket comprising metal-plated microporous polytetrafluoroethylene in either sheet or tube form. The sheets may be coated by conductive elastomers and the tubes filled with conductive elastomers.

1 Claim, 2 Drawing Sheets

5000 X

METALLIZED MICROPOROUS POLYTETRAFLUOROETHYLENE ELECTROMAGNETIC ENERGY SHIELDING GASKETING

This application is a continuation of application Ser. No. 07/380,828, filed Jul. 17, 1989, now abandoned.

FIELD OF THE INVENTION

This invention relates to electromagnetic energy shielding materials in the form of gasketing.

BACKGROUND

Electronic equipment such as radar, instrumentation and computer electronics are often contained in sealed shielded enclosures. This equipment requires shielding because electromagnetic energy in the radio frequency range interferes with the equipment's internal electronics. An effectively sealed and shielded enclosure prevents electromagnetic energy within it from inadvertently leaking out and thereby interfering with the proper operation of electromagnetically sensitive electronic equipment exterior to it and conversely prevents electromagnetic energy exterior to it from inadvertently entering it and causing problems with its proper operation. If the shielded enclosure is theoretically perfect, the electromagnetic isolation between the interior and exterior is perfect. However, shielded enclosures that house electronic equipment are less than perfect. Practical shielded enclosures require external access into the enclosure for such reasons as input and output connection, control devices, and for access covers, ports, doors and other types of access which are required for repair or adjustment to the internal electronic components. To maintain maximum shielding effectiveness, it is essential that enclosure accesses be as electromagentically leak-free as possible. Where input/output connectors or other similar type devices penetrate through enclosure walls, welding or other permanent sealing shielding means can many times be employed to prevent electromagnetic leakage, but for enclosure accesses that must be removable, such as covers, ports and doors, an electromagnetic gasket shield is required. There are many requirements that must be considered in order to provide effective electromagnetic gasket shielding; this is especially true for critical shielding applications.

Critical electromagnetic gasketing shielding applications, such as are found in military and aerospace applications and others, make demands on electromagnetic gasketing shielding materials that heretofore have not been completely met. Problems such as cracking or crazing of gasketing shielding materials when exposed to temperature extremes and high vibration, flaking of metallic fillers, critical torquing requirements when gasketed flanges are bolted together, solvent attack, chemical and electrochemical induced corrosion, high outgassing owing to residual unreacted components, and heavy weight are a few of the undesirable characteristics that cause problems which limit the usefulness of existing materials and degrade electromagnetic gasketing shielding effectiveness.

Important requirements for effective electromagnetic gasket shielding for critical applications are characterized by the electrical properties of high electrical conductivity and low resistivity to ensure maximum transfer of electromagnetic energy across the gasketed interfaces of the enclosure to minimize electromagnetic leakage. Maximum interfacial transfer of electromagnetic energy results in high shielding effectiveness.

Mechanical sealing properties are also important. An effective mechanical seal as well as effective electromagnetic shield prevents dust, dirt or other potentially damaging external environmental elements from entering into the shielded enclosure while maintaining the integrity of the internal environment of the enclosure. An effective mechanical/electromagnetic seal conforms easily to irregular as well as highly machined mating surfaces, does not deteriorate owing to age, is resistant to solvent attack, chemical or electrochemical induced corrosion, compression forces, functions effectively and is undamaged throughout a wide temperature range, remains leak-free under both high positive and negative pressures, does not require critical torquing to maintain its gasketing and shielding electromagnetic integrity, has low gas diffusion rates when compressed and densified, and has no outgassing. Also of importance is high compression and shear strength, flexibility and resiliency, light weight, and, if metal filled or plated, no cracking or flaking under the stresses of gasket shielding applications.

There are many good electromagnetic shielding gasketing materials commercially available which are utilized in critical applications, one of the best being conductive elastomeric gasketing. Conductive elastomeric gasketing utilizes silicone or fluorosilicone as the elastomeric binder and silver, silver-copper alloy, or silver-aluminum particles as the conductive filler. The best conductive elastomeric gasketing provides 70 to 120 DB shielding effectiveness in the electromagnetic frequency range of 200 kilohertz to 10 gigahertz. However, because of the many critical electromagnetic gasket shielding applications that require most or all of the above properties, to date it has not been possible with conductive elastomeric electromagnetic shielding or with other previous materials or means to produce electromagnetic gasketing shielding that meets all of the above requirements for critical applications. This invention provides a process and composition for the effective gasketing and electromagnetic energy shielding for critical gasketing and shielding applications through this use of metal-plated microporous PTFE.

Polytetrafluoroethylene (PTFE) seals and gaskets per se are known in the art. West German 3,339,018 describes a seal made from extruded and oriented microporous PTFE which has a greater height than width to compensate for the unevenness of flange surfaces to be sealed. Only small flange forces are needed for a predetermined leak pressure. No fillers are mentioned or application to electromagnetic gasketing. U.S. Pat. No. 4,147,824 shows plastic seals for use in valves which control reactive and aggressive chemicals made from porous PTFE covered with smooth dense PTFE, which layers are sintered together. The porous PTFE is prepared from filled PTFE from which the filler has been dissolved by a solvent to leave a porous-structure. The material is used for annular pressure seals. Another type of sealing material containing PTFE is disclosed in U.S. Pat. No. 4,042,747 which comprises particulate material interconnected and entrapped by fibrillated PTFE. Inorganic particulates were utilized in the seals.

SUMMARY OF THE INVENTION

In accordance with this invention, a process and composition is provided which utilizes metallized microporous PTFE gasketing/electromagnetic energy shielding materials to overcome the disadvantages and limitations of prior electromagnetic gasketing shielding materials by providing new and improved gasketing shielding materials that are suitable for critical gasketing shielding applications.

This invention provides gasketing shielding materials that have excellent effective electromagnetic gasketing shielding characteristics and properties throughout a broad radio frequency and electromagnetic energy spectrum. This invention provides electromagnetic gasketing shielding materials that have excellent mechanical sealing characteristics and properties throughout a broad range of environmental conditions while providing excellent stability, durability, and other properties that are important for critical gasketing shielding applications.

DETAILED DESCRIPTION OF THE INVENTION

The preferred microporous PTFE materials of construction for this invention are those manufactured by W.L. Gore and Associates, Inc. and are sold under the trademark GORE-TEX® membrane and are porous expanded PTFE materials in various forms, densities and porosities disclosed in U.S. Pat. No. 3,953,566 which describes processes for manufacturing microporous, high strength, shaped PTFE articles. The articles are characterized by nodes of substantially solid PTFE interconnected by fibrils. The above and related U.S. Pat. Nos. 4,187,390, 3,962,153, and 4,096,227 are hereby incorporated by reference into this application.

The embodiments of this invention comprise metal plating, in accordance with Manniso U.S. Pat. Nos., 4,557,957 and 4,720,400, one or more of the metals nickel, cobalt, copper, tin, silver, gold, platinum or other electroplatable or electroless-platable metals either singly or in combination onto microporous PTFE materials. The platable metals, and the type of microporous PTFE materials used in the manufacturing of this electromagnetic gasketing shielding are selected on the basis of the intended electromagnetic gasketing shielding application end use.

Also other materials both organic and inorganic, natural and synthetic, either singularly or in combination may be used with the metallized microporous PTFE materials of this invention. Additionally, other microporous materials with the same or similar properties as GORE-TEX microporous PTFE membrane materials may also be used as stated above.

Figure 1:
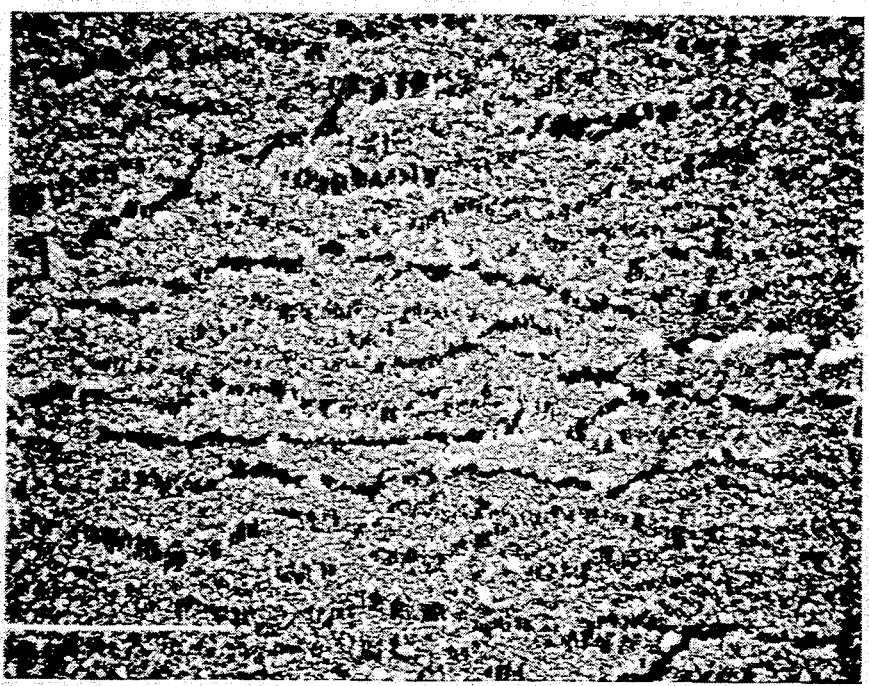
FIG. 1 discloses a photomicrograph at 5000X magnification showing the surface of a copper/silver/gold 0.5 micrometer pore size PTFE membrane sheet, designated Sample A.
Figure 2:
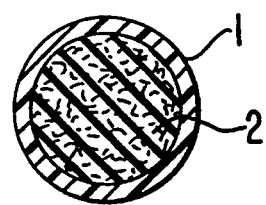
FIG. 2 shows a cross section of a copper/silver/gold 3.5 micrometer pore size PTFE tube that has been metallized and filled with a fluoroelastomer, designated Sample B.
Figure 3:
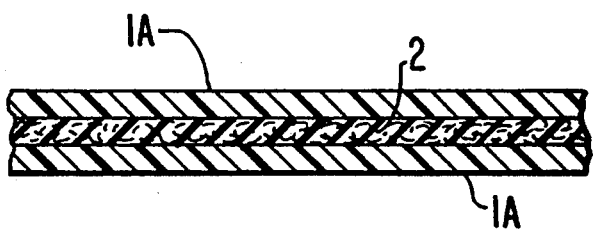
FIG. 3 describes a gasket comprising an elastomer layer sandwiched between membranes of metallized microporous PTFE.
Figure 4:
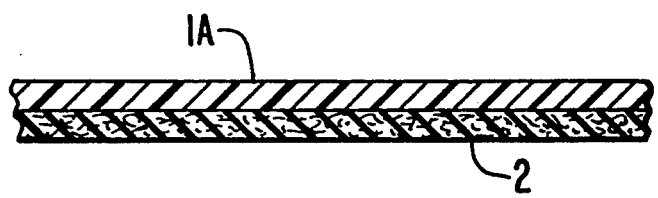
FIG. 4 shows a gasket comprising an elastomer layer combined with one layer of metallized microporous PTFE membrane.
Figure 5:
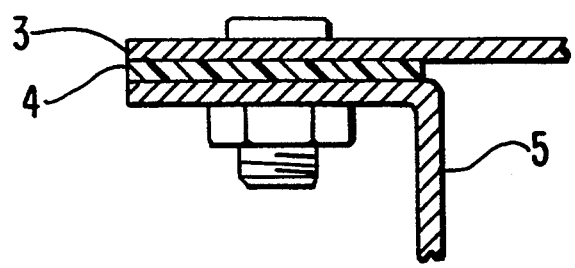
FIG. 5 describes a copper/silver 0.5 micrometer pore size PTFE membrane sheet compressed between flanges.

Referring now to the figures to more clearly delineate the invention, FIG. 1 discloses a photomicrograph at 5000X magnification of the surface of a metallized sheet of microporous PTFE membrane, prepared according to the two Manniso patents above and designated Sample A. Copper followed by silver, then gold have been plated in sequence onto the surfaces of the fibrils and nodes which comprises the body of microporous PTFE. FIG. 2 shows a cross section of a metal-plated (metallized) microporous PTFE tube 1 which has been filled with a resilient fluoroelastomer 2 to provide resilient support for the tube to provide a gasket (designated Sample B). FIGS. 3 and 4 show cross-sections of gaskets comprising sheets of gasketing material of the invention. One or two layers of metal-plated (metallized) microporous PTFE sheet 1A is combined with a layer of resilient fluoroelastomer 2. FIG. 5 discloses a cross section of an edge portion of a flange closure to a metal enclosure for electronic equipment or the like. The metal parts of the flange are 3 and 5 and the gasket 4 is of metallized microporous PTFE, such as embodied in the tube shown in FIG. 2 or the sheets shown in FIGS. 3 or 4.

EXAMPLES

Example I

An example of one particular embodiment of this invention is that of a 6 inch×6 inch microporous PTFE membrane of 0.6 g./cc. density, 20 mil thickness, 73% porosity, 40 micrometer nominal fibril length, and an average pore size of 0.5 micrometers which was first copper-plated in both its outer and inner surfaces and penetrating throughout its volume in accordance with the manfacturing teachings of the above Manniso patents, and then silver-plated and finally gold plated over the silver using Known metal-plating methods to produce a metallized microporous PTFE gasketing/electromagnetic energy shielding material that had the following characteristics and properties.

Electrical Properties: high electrical conductivity, a low resistivity of 0.004 ohm/cm, and 70 DE) to 120 DB shielding effectiveness in the EM frequency range of 200 Kilohertz to 10 gigahertz.

Mechanical Sealing Properties: withstood pressures to 3000 pounds per square inch on both smooth and phonograph-finished flanges without seal leakage or electromagnetic performance deterioration.

Stability/Durability: showed no measurable change in sealing or shielding effectiveness owing to aging, chemical or electrochemical attack and remained functional and undamaged throughout a wide temperature range of (−450 to +600° F.). The copper/gold plated material of invention showed no signs of cracking, crazing or metal flaking under the stresses of its gasketing shielding application testing, and no outgassing.

Other Properties: density was 0.61 g./cc. after metal plating, tensile strength 4800 psi, tear strength 232 PPI, elongation to break 25%, and hardness shore "A" durometer less than 10.

The copper/silver/gold metal plating combination in this example was chosen to provide very low electrical resistivity along with excellent corrosion resistance. Gold, platinum, rhodium and other noble metals have excellent chemical and electrochemical resistance. However, gold has a higher specific resistance than silver, 14.5 ohms per cir-mil-ft vs. 9.8 ohms per cir-mil-ft for silver. For maximum conductivity, minimum resistivity where chemical or electrochemical conditions will allow, the practices of the invention can be tailored to produce a copper/silver metallized material of construction. Other platable metal combinations that would be advantageous for specific critical electromagnetic gasketing shielding application can be manufactured within the scope of this invention.

As can be understood, the above example meets all the requirements for an effective electromagnetic gasketing shielding material for a particular type of critical gasketing shielding application as above described and tested, but that does not require resilient gasketing shielding. Resilient gasketing shielding is required under the following application conditions: when a gasketed shielded flange is bolted together and sealed after torquing and high internal pressures are generated which cause the flange seal to unload, then under these conditions a resilient seal will follow the flange unloading and within limits maintain sealing shielding effectiveness. With the non-resilient gasketing shielding material of this invention, a properly designed high pressure enclosure would require an excess of 3000 psi to leak owing to flange unloading. A second requirement for resilient sealing is where very low flange bolting, torquing, or sealing force are present, such as are found in a shielded enclosure door, which owing to low sealing force upon closing, requires a resilient gasketing shield to maintain effective gasketing shielding for critical applications. Such resilient gasketing, such as depicted in FIGS. 3 and 4, where resilient material 2, is shown layered with metallized microporous PTFE sheet material 1A and in FIG. 2 where metallized microporous PTFE tube 1 is filled with elastomer 2. The elastomeric material 2 may comprise fluoroelastomer, such as fluorosilicones or fluoro rubber, or may be a urethane rubber. Elastomeric material 2 may contain conductive particles of carbon, metal, metal alloys, and the like, such as aluminum, copper, copper alloys, iron, iron alloys, nickel, gold, silver, silver-copper alloys, or silver-aluminum alloys.

Example II

While the previous example dealt with effective gasketing/shielding for critical applications that do not require resilient gasketing/shielding, another embodiment of this invention is an example of a resilient gasketing/shielding material that meets all the requirements for effective gasketing/shielding for critical applications that require resiliency and is as follows:

A 6-inch long microporous PTFE tube, 0.47 inches OD and a wall thickness of 0.039 inch, 70% porosity, 100 micrometer nominal fibril length, and an average pore size of 3.5 micrometers was first copper plated in both its outer and inter surfaces and penetrating throughout its volume in a accordance with the manufacturing teachings of the above Manniso patents and then silver-plated and finally gold plated over the silver using known metal plating methods to produce a metallized microporous PTFE tube. The inside of the metallized tube was then filled with an approximately 55 durometer fluoroelastomer to produce a metallized microporous PTFE/fluoroelastomer filled resilient gasketing/ electromagnetic energy shielding material that has the following characteristics and properties.

Electrical Properties: high electrical conductivity, low resistivity, 0.004 ohm/cm, 70 DB to 120 DB shielding effectiveness in the electromagnetic range of 300 Kilohertz to 10 gigahertz. Mechanical Sealing Properties: withstood pressures to 3000 pounds per square inch on both smooth and phonograph finished flanges without seal leakage. The resilient seal showed no leakage or electromagnetic performance deterioration at a low sealing force of 100 psi and no leakage or electromagnetic performance deterioration when sealing force was reduced by 50% to 50 psi.

Stability/Durability: showed no measurable changes in sealing or shielding effectiveness owing to chemical or electrochemical attack and remained functional and undamaged throughout a wide temperature range of ($-40°$ F. to $+450°$ F.). The lower operating range is owing to the addition and limitations of the fluoroelastomer; however, it is well within the range for most resilient electromagnetic gasketing applications. The copper/silver/gold-plated material of the invention showed no signs of cracking, crazing, or metal flaking under the stresses of its gasketing shielding application testing.

Other Properties: density was 0.61 gm./cc. for the metal plated PTFE tubing but, owing to the addition of the fluoroelastomer, approximate specific gravity 1.9. The combination specific gravity was approximately 2.0, tensile strength 4800 psi, tear strength 232 PPI, elongation to break 80%, and hardness shore "A" durometer approximately 55.

Additionally, where application will allow, and resilient gasketing shielding is required, metals such as copper, silver, aluminum or other suitable conductive materials, individually or in combination, can be added as elastomeric fillers to increase volumetric conductivity of the gasketing shielding of this invention. Here the metal-filled elastomer is bonded to and encapsulated by the metal-plated PTFE membrane. The bonding in conjunction with the metal-plated membrane encapsulation mitigates the effects of elastomeric cracking, crazing, or metal flaking owing to the environmental stresses imposed by critical gasketing shielding applications.

For this example, the copper/silver/gold metallized tubing was filled with a fluoroelastomer to provide a resilient electromagnetic gasketing shielding of this invention that has a operating temperature range of $-40°$ F. to $+450°$ F. and can withstand chemical attach such as jet fuel solvent attack. However, for applications that do not require a broad temperature operating range or high resistance to solvent attack, elastomeric silicone can be used as a resilient filler or where allowable, polyurethane for low-durameter high-resiliency applications as well as other suitable elastomeric materials can be incorporated depending on the specific application requirements for resilient electromagnetic gasketing shielding of this invention. Preferred fluoroelastomers for use in the invention are fluoro silicones.

The two examples are meant to illustrate but not limit the possibilities that are within the scope of this invention. This invention encompasses the combining of other materials with metallized microporous PTFE or using metallized microporous PTFE only to produce metallized microporous PTFE gasketing/electromagnetic energy shielding materials that provide effective gasketing and shielding for critical as well as non-critical electromagnetic gasketing shielding applications.

The new materials of the invention will not crack, craze of flake-off its metal plating when exposed to broad temperature extremes or high compression and vibration forces. It does not require special torquing or critical flange preparation or machining for effective sealing or shielding. It is highly resistant to solvent or chemical attack and electrochemical induced corrosion and is light in weight. Also, it provides excellent gasketing and shielding effectiveness throughout a wide pressure range and radio frequency range.

Metallized microporous PTFE gasketing/electromagnetic energy shielding materials can be manufactured in accordance with the provisions of this invention and utilized in accordance with the processing provisions of the invention so as to meet all of the above properties and requirements for critical gasketing shielding applications.

I claim:

1. A gasket for sealing a flanged enclosure comprising a resilient tube of metallized expanded microporous polytetrafluoroethylene wherein the interior hollow tubular space within said tube is filled with a resilient elastomer.

* * * * *